United States Patent
Kim et al.

(10) Patent No.: US 10,171,088 B1
(45) Date of Patent: Jan. 1, 2019

(54) QUANTUM CIRCUIT FOR SHIFTING PHASE OF TARGET QUBIT BASED ON CONTROL QUBIT

(71) Applicant: ELECTRONICS AND TELECOMMUNICATIONS RESEARCH INSTITUTE, Daejeon (KR)

(72) Inventors: Taewan Kim, Daejeon (KR); Byung-Soo Choi, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 16/034,073

(22) Filed: Jul. 12, 2018

(30) Foreign Application Priority Data

Jul. 12, 2017 (KR) .................. 10-2017-0088649
Jun. 22, 2018 (KR) .................. 10-2018-0072376

(51) Int. Cl.
*H03K 19/195* (2006.01)
*H03K 19/20* (2006.01)
*G06N 99/00* (2010.01)

(52) U.S. Cl.
CPC ......... *H03K 19/195* (2013.01); *G06N 99/002* (2013.01); *H03K 19/20* (2013.01)

(58) Field of Classification Search
None
See application file for complete search history.

(56) References Cited

U.S. PATENT DOCUMENTS

| 7,496,203 | B2 | 2/2009 | Choi et al. | |
| 7,791,780 | B2* | 9/2010 | Munro | G06N 99/002 359/107 |
| 2004/0264898 | A1* | 12/2004 | Munro | B82Y 10/00 385/122 |
| 2006/0056631 | A1* | 3/2006 | Beausoleil | B82Y 10/00 380/256 |
| 2010/0150349 | A1 | 6/2010 | Choi et al. | |

OTHER PUBLICATIONS

Vadym Kliuchnikov et al., "Fast and efficient exact synthesis of single qubit unitaries generated by Clifford and T gates", Quantum Information and Computation, Mar. 1, 2013, vol. 13, No. 7-8, pp. 607-630.

* cited by examiner

*Primary Examiner* — Anh Tran

(57) ABSTRACT

The inventive concept relates to a quantum circuit that shifts the phase of a target qubit by $\pi/2^{n-1}$ based on a control qubit. The quantum circuit may include a first auxiliary circuit, a rotation gate, and a second auxiliary circuit. The first auxiliary circuit converts the first qubit state into the second qubit state according to the entanglement of a control qubit, a target qubit, and an ancillary qubit having a |0> state. The rotation gate shifts the phase for some basis states of the second qubit state by $\pi/2^{n-1}$, and converts the second qubit state to the third qubit state. The second auxiliary circuit converts the third qubit state to the fourth qubit state such that the phase of the target qubit is shifted by $\pi/2^{n-1}$.

16 Claims, 7 Drawing Sheets

US 10,171,088 B1

QUANTUM CIRCUIT FOR SHIFTING PHASE OF TARGET QUBIT BASED ON CONTROL QUBIT

CROSS-REFERENCE TO RELATED APPLICATIONS

This U.S.-non-provisional patent application claims priority under 35 U.S.C. § 119 of Korean Patent Application Nos. 10-2017-0088649, filed on Jul. 12, 2017, and 10-2018-0072376, filed on Jun. 22, 2018, the entire contents of which are hereby incorporated by reference.

BACKGROUND

The present disclosure relates to quantum computing, and more particularly to a quantum circuit for shifting the phase of a target qubit based on a control qubit.

By using the principle of quantum mechanics, a quantum computer performs calculation based on the qubits represented by the superposition of '0' and '1', so that it may have a much higher calculation speed than a digital computer using bits represented by only '0' or '1'. With the development of quantum computing technology, any arbitrary single-qubit gate or Z-rotation gate may be implemented with relatively high accuracy. However, as the amount of computation increases, it is difficult to perform scalable quantum computing in a currently-implemented gate having a small error rate. To solve this, calculation of a fault-tolerant scheme which guarantees an arbitrary probability of success is required. In order to ensure the reliability of quantum computing, the operation of all quantum algorithms should be expressed by a universal set proposed from the fault tolerant protocol.

It is difficult to make all calculation devices required in any quantum algorithm in advance. Therefore, if a quantum algorithm to be executed is given, a process, in which a quantum algorithm is represented by a finite number of basic gates, is required. This process may be referred to as circuit synthesis problem, and the basic gates of quantum computing may be implemented with a universal set including Hadamard gate (H-gate), Phase gate (S-gate), $\pi/8$ phase shift gate (T-gate), and Controlled-NOT (CNOT) gate. Although the quantum algorithm has lower computational complexity than the conventional algorithm in the problem of factoring, when the quantum algorithm is decomposed into the basic gates described above, due to the increase in the number of gates, the advantages described above may be offset. Thus, there is a need to reduce the number of such gates.

Furthermore, there is a need for circuit synthesis for 2-qubit gates. Among the 2-qubit gates, a Controlled-Rn gate, which shifts the phase of the target qubits based on the control qubits, receives attention in that it constitutes a key part of many other quantum computations such as Quantum Fourier Transform (QFT). Thus, the decomposition of the Controlled-Rn gate is important in the overall part of the quantum algorithm, and there is a need to reduce the number of gates during the decomposition of the Controlled-Rn gate.

SUMMARY

The present disclosure is to provide a quantum circuit capable of reducing the number of basic gates included in the controlled-rotation gate that shifts the phase of the target qubit based on the control qubits and reducing the operation time of the quantum computing.

An embodiment of the inventive concept provides a quantum circuit according to an embodiment of the inventive concept shifts the phase of the target qubit by $\pi/2^{n-1}$ based on the control qubit. The quantum circuit includes a first auxiliary circuit configured to convert a first qubit state according to an entanglement of the control qubit, the target qubit, and an ancillary qubit having a $|0\rangle$ state to a second qubit state, a rotation gate configured to shift a phase for at least one basis state of the second qubit state by $\pi/2^{n-1}$ to convert the second qubit state to a third qubit state; and a second auxiliary circuit configured to convert the third qubit state to a fourth qubit state so as to shift the phase of the target qubit by $\pi/2^{n-1}$. The first auxiliary circuit determines a $|111\rangle$ basis state of the second qubit state based on a $|110\rangle$ basis state of the first qubit state, and the second auxiliary circuit determines a $|110\rangle$ basis state of the fourth qubit state based on a $|111\rangle$ basis state of the third qubit state.

For example, the first auxiliary circuit and the second auxiliary circuit may be the same. The first auxiliary circuit may determine the $|110\rangle$ basis state of the second qubit state by shifting a phase for the $|110\rangle$ basis state of the first qubit state by $-\pi/2$, and the second auxiliary circuit may determine the $|111\rangle$ basis state of the fourth qubit state by shifting a phase for the $|111\rangle$ basis state of the third qubit state by $\pi/2$.

For example, each of the first and second auxiliary circuits may include two Hadamard gates, four T-gates, and four CNOT gates. Each of the first auxiliary circuit and the second auxiliary circuit may operate in a total of eight operations. Each of the first auxiliary circuit and the second auxiliary circuit may perform $|000\rangle\langle000|+|001\rangle\langle001|+|010\rangle\langle010|-|011\rangle\langle011|+|100\rangle\langle100|+|101\rangle\langle101|+i|110\rangle\langle111|-i|111\rangle\langle110|$ calculation.

For example, the first auxiliary circuit and the second auxiliary circuit may be Hermitian to each other. The first auxiliary circuit may determine the $|111\rangle$ basis state of the second qubit state by shifting a phase for the $|110\rangle$ basis state of the first qubit state by $-\pi/2$, further determine the $|100\rangle$ basis state of the second qubit state based on the $|010\rangle$ basis state of the first qubit state, and further determine the $|010\rangle$ basis state of the second qubit state based on the $|100\rangle$ basis state of the first qubit state, and the second auxiliary circuit may determine the $|110\rangle$ basis state of the fourth qubit state by shifting a phase for the $|111\rangle$ basis state of the third qubit state by $\pi/2$, further determine the $|100\rangle$ basis state of the fourth qubit state based on the $|010\rangle$ basis state of the third qubit state, and further determine the $|010\rangle$ basis state of the fourth qubit state based on the $|100\rangle$ basis state of the third qubit state.

For example, each of the first and second auxiliary circuits may include two Hadamard gates, four T-gates, and six CNOT gates. Each of the first auxiliary circuit and the second auxiliary circuit may operate in a total of ten operations. The first auxiliary circuit performs $|000\rangle\langle000|+|001\rangle\langle001|+|010\rangle\langle100|+|011\rangle\langle101|+|100\rangle\langle010|+|101\rangle\langle011|-i|110\rangle\langle111|-i|111\rangle\langle110|$ calculation, and the second auxiliary circuit performs $|000\rangle\langle000|+|001\rangle\langle001|+|010\rangle\langle100|+|011\rangle\langle101|+|100\rangle\langle010|+|101\rangle\langle011|+i|110\rangle\langle111|+i|111\rangle\langle110|$ calculation.

In an embodiment of the inventive concept, a quantum circuit according to an embodiment of the inventive concept includes a first CNOT gate configured to perform a CNOT calculation on an ancillary qubit having a $|0\rangle$ state based on the target qubit, a second CNOT gate configured to perform a CNOT calculation on the target qubit based on the control qubit, a first rotation gate configured to shift a phase of the control qubit by $\pi/2^n$, a second rotation gate configured to shift a phase of the target qubit converted by the second CNOT gate by $-\pi/2^n$, a third rotation gate configured to shift a phase of the ancillary qubit converted by the first CNOT gate by $\pi/2^n$, a third CNOT gate configured to perform a CNOT calculation on the target qubit converted by the second rotation gate based on the control qubit converted by the first rotation gate, and a fourth CNOT gate configured to perform a CNOT calculation on the ancillary qubit converted by the third rotation gate based on the target qubit converted by the third CNOT gate. For example, a quantum circuit may operate with a total of 5 operations.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

In the following, embodiments of the inventive concept will be described in detail so that those skilled in the art easily carry out the inventive concept.

Figure 1:
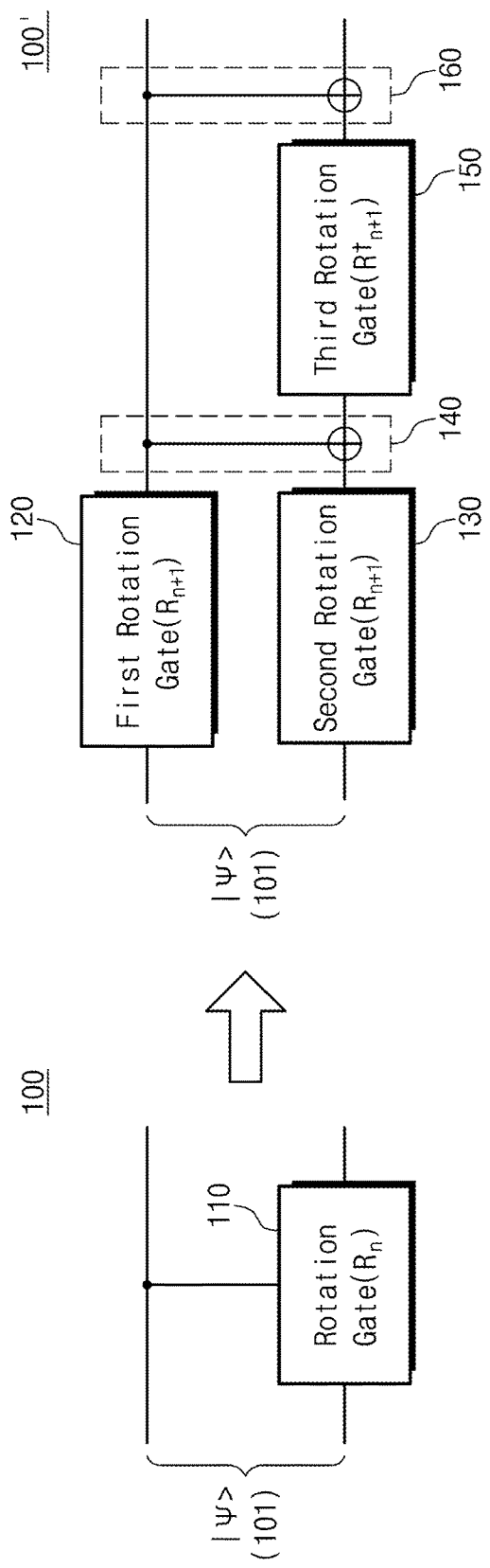
FIG. 1 is a view for explaining a controlled-rotation gate included in a quantum circuit to be implemented in an embodiment of an inventive concept.

FIG. 1 is a view for explaining a controlled-rotation gate included in a quantum circuit to be implemented in an embodiment of an inventive concept. Referring to FIG. 1, a quantum circuit 100 includes a controlled-rotation gate 110, which is a 2-qubit-based gate. The logic qubit |Ψ> 101 with a 2-qubit state is inputted to the quantum circuit 100. A logic qubit 101 includes a control qubit and a target qubit. Each of the control qubit and the target qubit may have a single-qubit state. Depending on the superposition of the |0> basis state and the |1> basis state, the single-qubit state may be expressed as $a_0|0>+a_1|1>$ and satisfy $|a_0|^2+|a_1|^2=1$. Depending on the entanglement of the control qubit and the target qubit, the logic qubit 101 may be expressed as $|Ψ>=a_{00}|00>+a_{01}|01>+a_{10}|10>+a_{11}|11>$.

The controlled-rotation gate 110 shifts the phase of the target qubit by $\pi/2^{n-1}$ based on the state of the control qubit. Here, n may be an integer. For example, if the control qubit is in the |1> state, the phase of the target qubit may be shifted by $\pi/2^{n-1}$. If the control qubit is in the |0> state, the phase of the target qubit may not be shifted. The rotation gate Rn and the controlled-rotation gate Controlled-Rn for shifting the phase of the single-qubit are defined as in Equation 1.

$$R_n = \begin{bmatrix} 1 & 0 \\ 0 & e^{i\pi/2^{n-1}} \end{bmatrix}$$ [Equation 1]

$$\text{Controlled} - R_n = \begin{bmatrix} 1 & 0 & 0 & 0 \\ 0 & 1 & 0 & 0 \\ 0 & 0 & 1 & 0 \\ 0 & 0 & 0 & e^{i\pi/2^{n-1}} \end{bmatrix}$$

The controlled-rotation gate 110, which is a 2-qubit-based gate, may be decomposed into a quantum circuit 100' including a first rotation gate 120, a second rotation gate 130, a first CNOT gate 140, a third rotation gate 150, and a second CNOT gate 160. Here, the first to third rotation gates 120, 130, and 150 are single-qubit-based gates.

The first rotation gate 120 may shift the phase of the control qubit by $\pi/2^n$ and the second rotation gate 130 may shift the phase of the target qubit by $\pi/2^n$. The first CNOT gate 140 may perform a CNOT calculation on the target qubit converted by the second rotation gate 130 based on the control qubit converted by the first rotation gate 120. For example, if the control qubit is in the |1> state, the CNOT calculation may be a calculation that exchanges the value of the |1> basis state of the target qubit with the value of the |0> basis state of the target qubit. If the control qubit is in the |0> state, the state of the target qubit may be maintained. The CNOT gate that performs the CNOT calculation is defined by Equation 2.

$$CNOT = \begin{bmatrix} 1 & 0 & 0 & 0 \\ 0 & 1 & 0 & 0 \\ 0 & 0 & 0 & 1 \\ 0 & 0 & 1 & 0 \end{bmatrix}$$ [Equation 2]

The third rotation gate 150 may shift the phase of the target qubit converted by the first CNOT gate 140 by $-\pi/2^n$. The third rotation gate ($R^\dagger_{n+1}$) 150 may be Hermitian with the first rotation gate ($R_{n+1}$) 120 or the second rotation gate ($R_{n+1}$) 130. That is, the third rotation gate 150 may appear as a complex conjugate of the transpose matrix of the first rotation gate 120 or the second rotation gate 130. The second CNOT gate 160 may perform a CNOT calculation on the target qubit converted by the third rotation gate 150 based on the control qubit converted by the first rotation gate 120.

Each of the first through third rotation gates 120, 130, and 150 may be approximately decomposed into the basic gates of a universal set. That is, each of the first through third rotation gates 120, 130, and 150 may be implemented with a universal set including Hadamard gate (hereinafter referred to as H-gate), $\pi/8$ phase shift gate (hereinafter referred to as T-gate), and Controlled-NOT (CNOT) gate. The CNOT gate is as shown in Equation 2, and the H-gate and T-gate are defined as shown in Equation 3.

$$H = \frac{1}{\sqrt{2}} \begin{bmatrix} 1 & 1 \\ 1 & -1 \end{bmatrix}$$ [Equation 3]

$$T = \begin{bmatrix} 1 & 0 \\ 0 & e^{i\pi/4} \end{bmatrix}$$

Each of the first through third rotation gates 120, 130, and 150 may be decomposed into approximately 253 basic gates when they are approximately decomposed with an accuracy of $10^{-10}$. That is, the quantum circuit 100' may be decomposed into about 761 (=253*3+2) basic gates. Therefore, as the number of single-qubit-based rotation gates increases, the number of required basic gates sharply increases.

Figure 2:
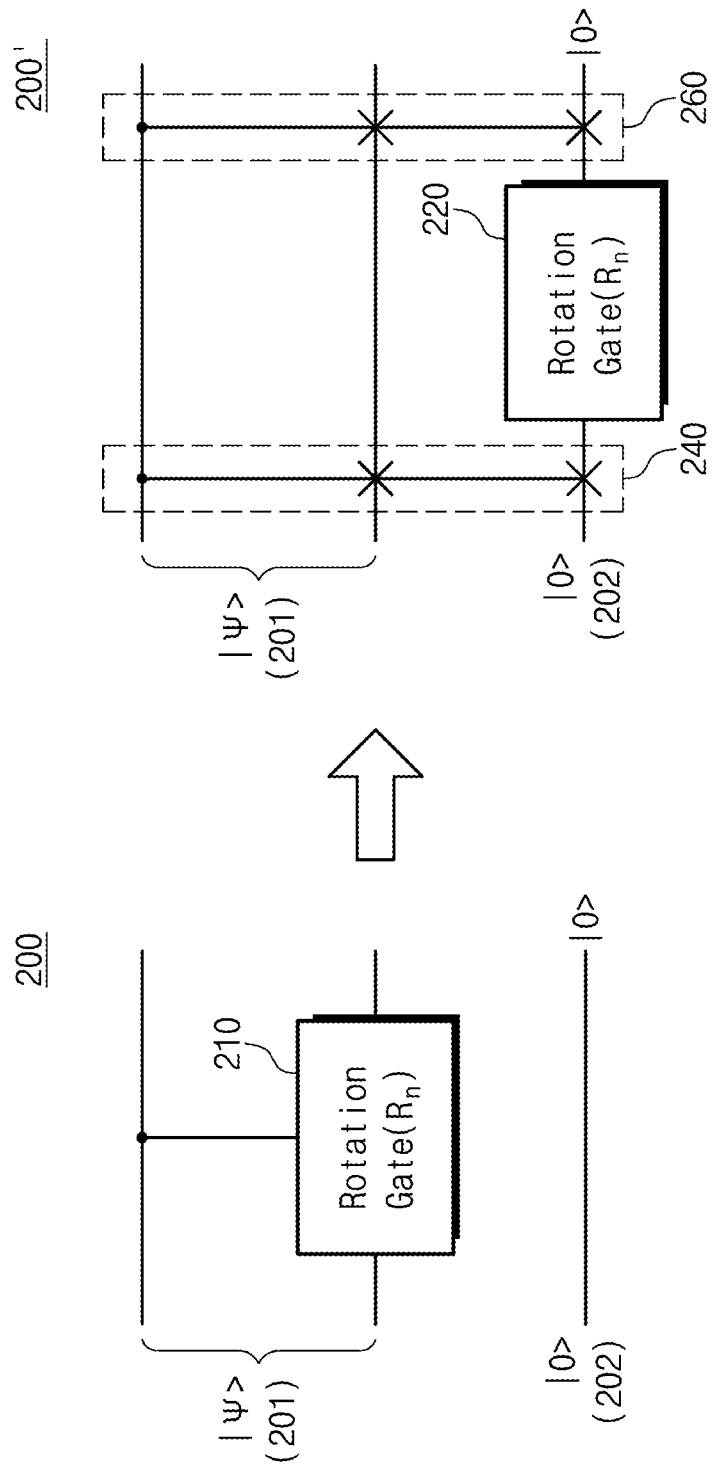
FIG. 2 is a view for explaining an embodiment using an ancillary qubit for the implementation of a controlled-rotation gate.

FIG. 2 is a view for explaining an embodiment using an ancillary qubit for the implementation of a controlled-rotation gate. Referring to FIG. 2, a quantum circuit 200 includes a controlled-rotation gate 210, which is a 2-qubit-based gate. The controlled-rotation gate 210 corresponds to the controlled-rotation gate 110 of FIG. 1. The logic qubit |Ψ> 201 with a 2-qubit state and an ancillary qubit 202 are inputted to the quantum circuit 200. The ancillary qubit 202 may be provided to ensure the efficiency of decomposition of the controlled-rotation gate 210, and may have the |0> state. If the ancillary qubit 202 is used, the calculation time for quantum computing may be reduced, the number of basic gates required may be reduced, and the accuracy of quantum computing may be improved.

The controlled-rotation gate 210, which is a 2-qubit-based gate, may be decomposed into a quantum circuit 200' including a rotation gate 220, a first controlled-swap gate 240, and a second controlled-swap gate 260. The rotation gate 220 is a single-qubit-based gate. The rotation gate 220 may shift the phase of the target qubit by $\pi/2^{n-1}$.

The first controlled-swap gate 240 and the second controlled-swap gate 260 may be a controlled-swap gate that exchanges the target qubit and the ancillary qubit 202 based on the control qubit. The first controlled-swap gate 240 exchanges the target qubit and the ancillary qubit 202 based on the control qubit. For example, if the control qubit is in the |1> state, the target qubit and ancillary qubit may be swapped with each other. As a result, the target qubit may be inputted to the rotation gate 220.

The second controlled-swap gate 260 swaps the ancillary qubit 202 swapped by the first controlled-swap gate 240 with the target qubit converted by the rotation gate 220, based on the control qubit. That is, the ancillary qubit 202 may be measured in the |0> state, and the target qubit may be measured by shifting the phase by $\pi/2^{n-1}$. The first controlled-swap gate 240 and the second controlled-swap-gate 260 may substantially have the same configuration.

Figure 3:
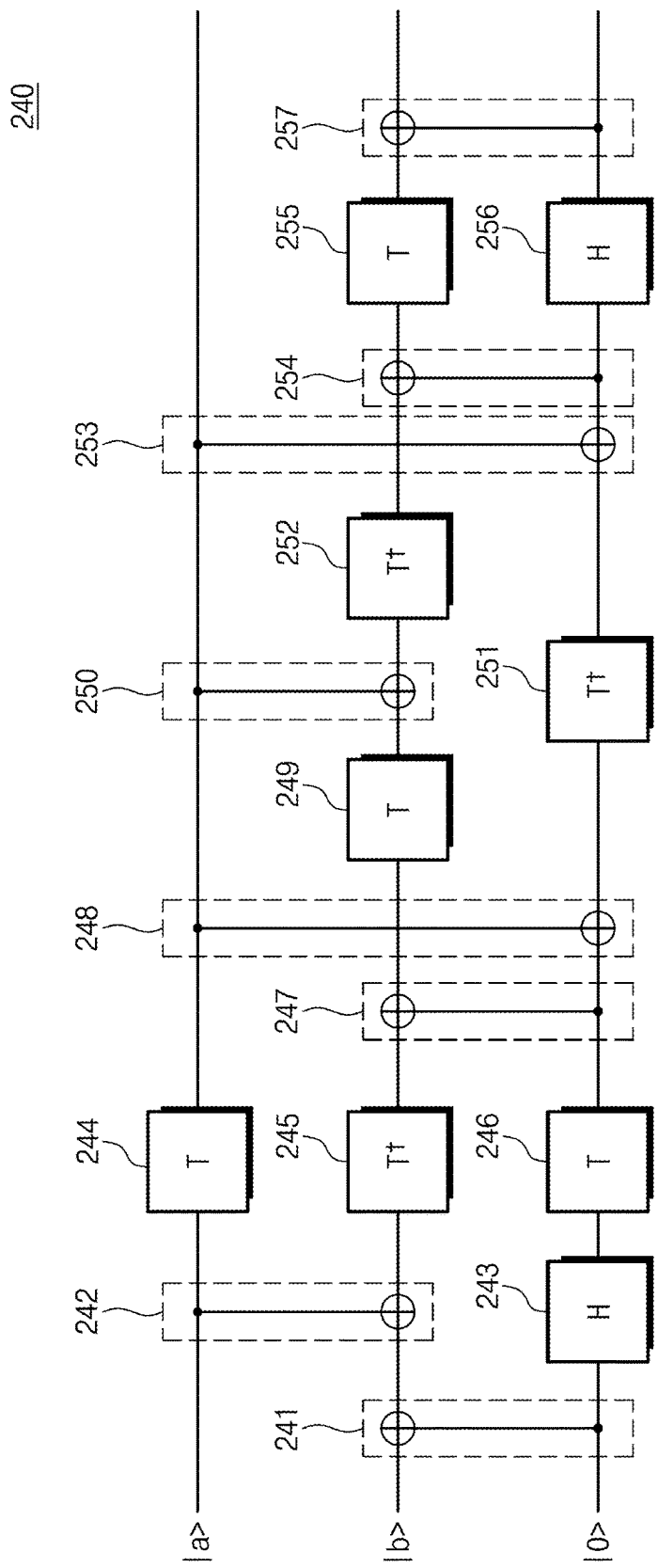
FIG. 3 is a circuit diagram of decomposing the controlled-swap gate of FIG. 2 into basic gates.

FIG. 3 is a circuit diagram of decomposing the controlled-swap gate of FIG. 2 into basic gates. The controlled-swap gate 240 of FIG. 3 corresponds to the first controlled-swap gate 240 or the second controlled-swap gate 260 of FIG. 2. 3, the controlled-swap gate 240 includes a first CNOT gate 241, a second CNOT gate 242, a first H-gate 243, a first T-gate 244, a second T-gate (T-gate) 245, a third T-gate 246, a third CNOT gate 247, a fourth CNOT gate 248, a fourth T-gate 249, a fifth CNOT gate 250, a fifth T-gate (T-gate) 251, a sixth T-gate (T-gate) 252, a sixth CNOT gate 253, a seventh CNOT gate 254, a seventh T-gate 255, a second H-gate 256, and an eighth CNOT gate 257.

The control qubit with state |a>, the target qubit with state |b>, and the ancillary qubit with state |0> may be inputted to the controlled-swap gate 240. In this case, the controlled-swap gate 240 may swap the target qubit and ancillary qubit based on the state of the control qubit. For example, if the control qubit is in the |a>=|1> state, the target qubit and ancillary qubit are swapped. Also, if the control qubit is in the |a>=|0> state, the target qubit and ancillary qubit are not swapped.

The controlled-swap gate 240 operates in a total of ten operations. During the first operation (first time), the first CNOT gate 241 operates. During the second operation (second time), the second CNOT gate 242 and the first H-gate 243 operate. During the third operation (third time), the first T-gate 244, the second T-gate 245 and the third T-gate 246 operate. During the fourth operation (fourth time), the third CNOT gate 247 operates. During the fifth operation (fifth time), the fourth CNOT gate 248 and the fourth T-gate 249 operate. During the sixth operation (sixth time), the fifth CNOT gate 250 and the fifth T-gate 251 operate. During the seventh operation (seventh time), the sixth T-gate 252 and the sixth CNOT gate 253 operate. During the eighth operation (eighth time), the seventh CNOT gate 254 operates. During the ninth operation (ninth time), the seventh T-gate 255 and the second H-gate 256 operate. During the tenth operation (tenth time), the eighth CNOT gate 257 operates.

The controlled-swap gate 240 operates with four T-gate operations. The T-gate operation may operate in four operations based on the second T-gate 245, the fourth T-gate 249, the sixth T-gate 252, and the seventh T-gate 255. Unlike the H-gate or CNOT gate, the T-gate is not a transversal gate, so the resource or time consumed in the quantum computing process is larger than other basic gates. Thus, the operation time of the quantum circuit and the resources for quantum computing may depend on the number of T-gates or the number of T-gate operations.

Referring to the quantum circuits 200 or 200' of FIG. 2 and the controlled-swap gate 240 of FIG. 3, the total number of basic gates and the total operations may be calculated to implement a controlled-rotation gate. If the rotation gate 220 is assumed to be one gate and one operation, the total number of basic gates included in the quantum circuit 200' may be 35, and the quantum circuit 200' may operate with a total of 21 operations.

Figure 4:
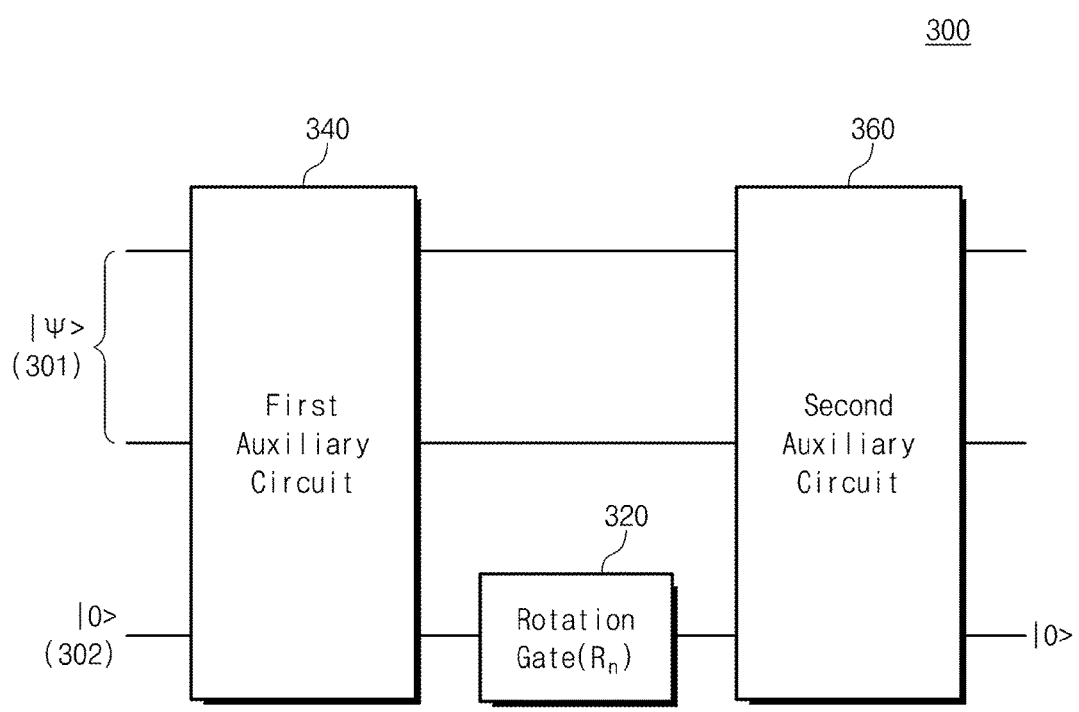
FIG. 4 is a block diagram of a quantum circuit according to an embodiment of the inventive concept.

FIG. 4 is a block diagram of a quantum circuit according to an embodiment of the inventive concept. Referring to FIG. 4, a quantum circuit 300 includes a rotation gate 320, a first auxiliary circuit 340, and a second auxiliary circuit 360. The quantum circuit 300 is a circuit for implementing a controlled-rotation gate such as the quantum circuit 100 or 200 shown in FIG. 1 or FIG. 2. The quantum circuit 300 shifts the phase of the target qubit by $\pi/2^{n-1}$ based on the state of the control qubit. The rotation gate 320 is a single-qubit-based gate. The rotation gate 320 may shift the phase of the inputted target qubit by $\pi/2^{n-1}$. The rotation gate 320 may be defined as the Rn gate in Equation 1.

A logic qubit 301 with a 2-qubit state and an ancillary qubit 302 are inputted to the quantum circuit 200. The logic qubit 301 includes a control qubit and a target qubit. The ancillary qubit 302 may have a |0> state. In this case, a 3-qubit state according to entanglement of control qubit, target qubit, and ancillary qubit 302 may appear. This qubit state may be expressed mathematically as a tensor product (|Ψ>⊗|0>), and when the logic qubit 101 is |Ψ>=$a_{00}$|00>+$a_{01}$|01>+$a_{10}$|10>+$a_{11}$|11>, it may be expressed as $a_{00}$|000>+$a_{10}$|010>+$a_{10}$|100>+$a_{11}$|110>.

The first auxiliary circuit 340 converts the first qubit state according to entanglement of logic qubit 301 and ancillary qubit 302 into a second qubit state. The second qubit state is determined according to the structure of the first auxiliary circuit 340, and this structure will be described later with reference to FIG. 5 and FIG. 6. The first auxiliary circuit 340 includes a plurality of basic gates. As described above, the basic gate may be an H-gate, a T-gate, or a CNOT gate. The first auxiliary circuit 340 may have fewer basic gates than the controlled-swap gate 240 of FIG. 3. In addition, the first auxiliary circuit 340 may be configured to operate with fewer operations or fewer T-gate operations than the controlled-swap gate 240 of FIG. 3. Thus, by the first auxiliary circuit 340, the operation time and resources of the quantum computing may be reduced.

The rotation gate 320 shifts the phase for some basis states by $\pi/2^{n-1}$ in the second qubit state converted by the first auxiliary circuit 340. As a result, the second qubit state may be converted to the third qubit state. The rotation gate 320 for converting from the second qubit state to the third qubit state may be expressed by the unit matrix I and the tensor product of the Rn gate according to Equation 1, such as (I⊗I⊗Rn).

The second auxiliary circuit 360 converts the third qubit state converted by the rotation gate 320 into the fourth qubit state. The fourth qubit state may be equal to the state according to the entanglement of the control qubit, the target qubit phase shifted by $\pi/2^{n-1}$, and the ancillary qubit of |0> state. The second auxiliary circuit 360 includes a plurality of basic gates. The second auxiliary circuit 360 may have fewer basic gates than the controlled-swap gate 240 of FIG. 3. In addition, the second auxiliary circuit 360 may be configured to operate with fewer operations or fewer T-gate operations than the controlled-swap gate 240 of FIG. 3. Thus, by the second auxiliary circuit 360, the operation time and resources of the quantum computing may be reduced. The structure of the second auxiliary circuit 360 may be the same as that of the first auxiliary circuit 340. Alternatively, the second auxiliary circuit 360 may be Hermitian with the first auxiliary circuit 340. The structure of the second auxiliary circuit 360 will be described later in detail with reference to FIGS. 5 and 6.

Figure 5:
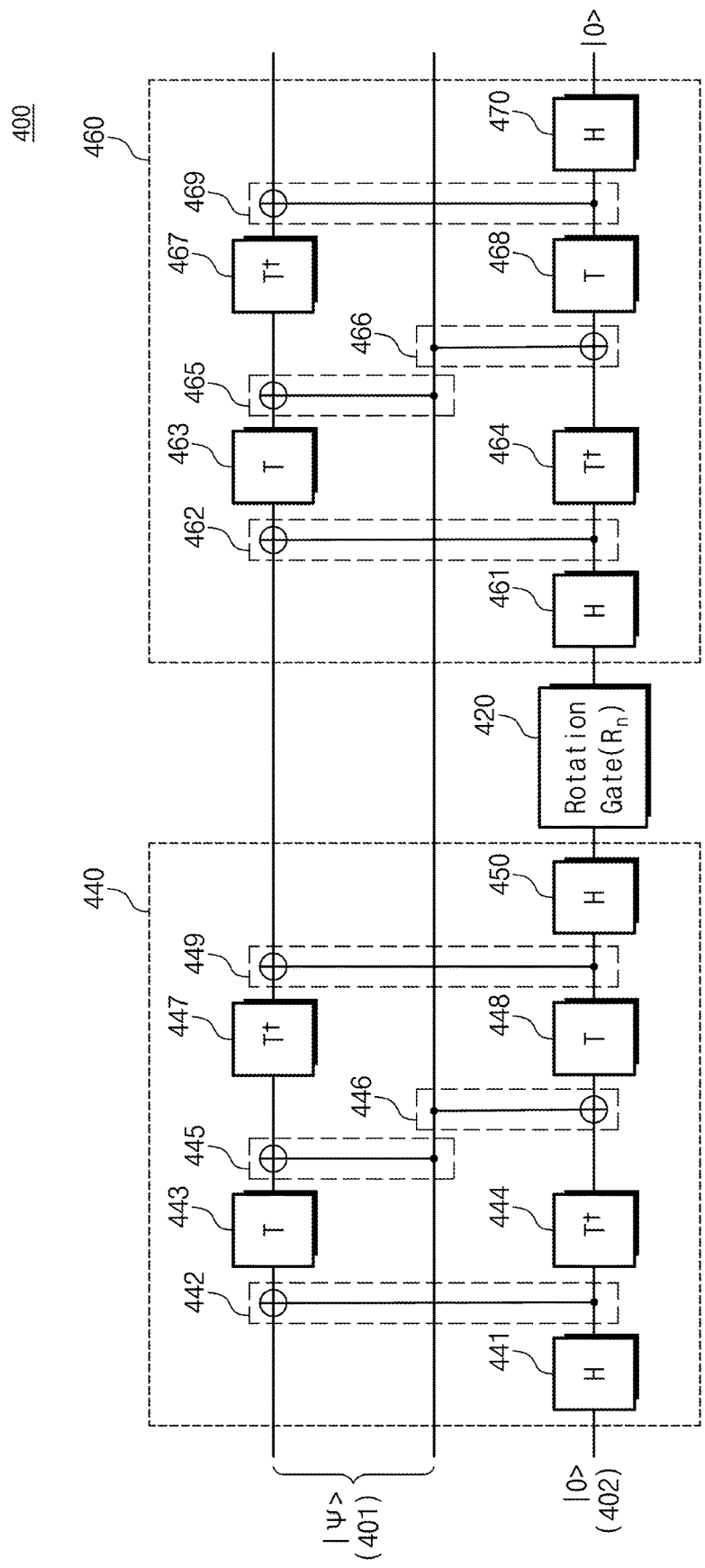
FIG. 5 is a circuit diagram embodying an embodiment of the quantum circuit of FIG. 4.

FIG. 5 is a circuit diagram embodying an embodiment of the quantum circuit of FIG. 4 Referring to FIG. 5, a quantum circuit 400 includes a rotation gate 420, a first auxiliary circuit 440, and a second auxiliary circuit 460. The rotation gate 420 corresponds to the rotation gate 320 of FIG. 4, the first auxiliary circuit 440 corresponds to the first auxiliary circuit 340 of FIG. 4, and the second auxiliary circuit 460 corresponds to the second auxiliary circuit 360 of FIG. 4. The logic qubit 401 including the control qubit and the target qubit, and the ancillary qubit 402 are inputted to the quantum circuit 400. The logic qubit 401 corresponds to the logic qubit 301 of FIG. 4 and the ancillary qubit 402 corresponds to the ancillary qubit 302 of FIG. 4.

The first auxiliary circuit 440 includes a first H-gate 441, a first CNOT gate 442, a first T-gate 443, a second T-gate ($T^\dagger$-gate) 444, a second CNOT gate 445, a third CNOT gate 446, a third T-gate ($T^\dagger$-gate) 447, a fourth T-gate 448, a fourth CNOT gate 449, and a second H-gate 450. The H-gate, T-gate, and CNOT gate included in the first auxiliary circuit 440 may be defined as described in Equations 2 and 3. The first auxiliary circuit 440 includes a total of 10 basic gates. Thus, a controlled-rotation gate may be implemented using fewer basic gates than the controlled-swap gate 240 including the 17 basic gates of FIG. 3. Further, since the quantum circuit 400 includes a smaller number of rotation gates than the quantum circuit 100' of FIG. 1, controlled-rotation gates may be implemented with fewer basic gates than in FIG. 1.

The first H-gate 441 performs Hadamard transform on the ancillary qubit 402. The first CNOT gate 442 performs a CNOT calculation on the control qubit based on the ancillary qubit converted by the first H-gate 441. The first T-gate 443 shifts the phase of the control qubit converted by the first CNOT gate 442 by $\pi/8$. The second T-gate 444 shifts the phase of the ancillary qubit converted by the first H-gate 441 by $-\pi/8$. The second CNOT gate 445 performs a CNOT calculation on the control qubit converted by the first T-gate 443 based on the target qubit. The third CNOT gate 446 performs a CNOT calculation on the ancillary qubit converted by the second T-gate 444 based on the target qubit.

The third T-gate 447 shifts the phase of the control qubit converted by the first CNOT gate 445 by $-\pi/8$. The fourth T-gate 448 shifts the phase of the ancillary qubit converted by the third CNOT gate 446 by $\pi/8$. The fourth CNOT gate 449 performs a CNOT calculation on the control qubit converted by the third T-gate 447 based on the ancillary qubit converted by the fourth T-gate 448. The second H-gate 450 performs Hadamard transform on the ancillary qubit converted by the fourth T-gate 448.

The first auxiliary circuit 440 operates in a total of 8 operations. Thus, the first auxiliary circuit 440 may operate with fewer operations than the controlled-swap gate 240 operating with a total of 10 operations of FIG. 3. Also, the first auxiliary circuit 440 operates with less than two T-gate operations than the controlled-swap gate 240 of FIG. 3. That is, the operation time of the quantum circuit 400 and the resources for quantum computing may be reduced. The first auxiliary circuit 440 may be defined as U of Equation 4 based on the operation of the basic gates described above.

$$U=(I\otimes I\otimes H)C_{31}(T^\dagger \otimes I\otimes T)C_{23}C_{21}(T\otimes I\otimes T^\dagger)C_{31}(I\otimes I\otimes H) \quad \text{[Equation 4]}$$

Referring to Equation 4, an operation of the first auxiliary circuit 440 proceeds from right to left. During the first operation, by the first H-gate 441, (I⊗I⊗ H) calculation is performed for the 3-qubit state (|Ψ>⊗|0>) by the logic qubit 401 and the ancillary qubit 402. During the second operation, $C_{31}\neg$ calculation is performed by the first CNOT gate 442. During the third operation, ($T\otimes I\otimes T^\dagger$) calculation is performed by the first and second T-gates 443 and 444. During the fourth operation, $C_{21}\neg$ calculation is performed by the second CNOT gate 445. During the fifth operation, $C_{23}\neg$ calculation is performed by the third CNOT gate 446. During the sixth operation, ($T^\dagger \otimes I\otimes T$) calculation is performed by the third and fourth T-gates 447 and 448. During the seventh operation, $C_{31}\neg$ calculation is performed by the fourth CNOT gate 449. During the eighth operation, (I⊗I⊗H) calculation is performed by the second H-gate 450. The calculation result of Equation 4 may be expressed as Equation 5.

$$U=|000><000|+|001><001|+|010><010|-|011><011|$$

$$+|100><100|+|101><101|+i|110><111|-i|111><110| \quad \text{[Equation 5]}$$

Referring to Equation 5, depending on the entanglement and superposition of logic qubit 401 and ancillary qubit 402, 8 basis states, |000>, |001>, |010>, |011>, ||00>, |101>, |110>, and |111> may appear. The 3-bit numbers represented in each basis state are in turn associated with the control qubit, the target qubit, and the ancillary qubit. The first auxiliary circuit 440 may not convert the values of |000>, |001>, |010>, |100>, and |101> basis states. The first auxiliary circuit 440 may shift the phase for the |011> basis state by π to determine it as the value of the |011> basis state. The first auxiliary circuit 440 may shift the phase for the |110> basis state by $-\pi/2$ to determine it as the value of the |111> basis state. The first auxiliary circuit 440 may shift the phase for the |111> basis state by $\pi/2$ to determine it as the value of the |110> basis state.

The second auxiliary circuit 460 includes a third H-gate 461, a fifth CNOT gate 462, a fifth T-gate 463, a sixth T-gate ($T^\dagger$-gate) 464, a sixth CNOT gate 465, a seventh CNOT gate 466, a seventh T-gate ($T^\dagger$-gate) 467, an eighth T-gate 468, an eighth CNOT gate 469, and a fourth H-gate 450. Since the arrangement structure of the basic gates included in the second auxiliary circuit 460 is the same as the arrangement structure of the basic gates included in the first auxiliary circuit 440, a detailed description thereof will be omitted.

The rotation gate 420, the first auxiliary circuit 440, and the second auxiliary circuit 460 may be implemented to perform the same operation as the controlled-rotation gate, as shown in Equation 6.

$$U(I \otimes I \otimes Rn)U(|\Psi\rangle \otimes |0\rangle)$$

$$= U(I \otimes I \otimes Rn)U(a_{00}|000\rangle + a_{01}|010\rangle + a_{10}|100\rangle + a_{11}|110\rangle)$$

$$= U(I \otimes I \otimes Rn)(a_{00}|000\rangle + a_{01}|010\rangle + a_{10}|100\rangle - ia_{11}|111\rangle)$$

$$= U(a_{00}|000\rangle + a_{01}|010\rangle + a_{10}|100\rangle + e^{i\pi/2^{n-1}}a_{11}|111\rangle)$$

$$= a_{00}|000\rangle + a_{01}|010\rangle + a_{10}|100\rangle - e^{i\pi/2^{n-1}}a_{11}|110\rangle$$

$$= (\text{Controlled-}Rn \otimes I)(|\Psi\rangle \otimes |0\rangle) \quad \text{[Equation 6]}$$

Referring to Equation 6, the first auxiliary circuit 440, the single-qubit-based rotation gate 420, and the second auxiliary circuit 460 are operated from the right side to the left side. By the first auxiliary circuit 440, the value of the $|110\rangle$ basis state is phase-shifted by $-\pi/2$, so that the value of the $|111\rangle$ basis state is determined. By the rotation gate 420, the value of the $|111\rangle$ basis state is phase-shifted by $\pi/2^{n-1}$. By the second auxiliary circuit 460, the value of the $|111\rangle$ basis state is phase-shifted by $-\pi/2$, so that the value of the $|110\rangle$ basis state is determined. As a result, the quantum circuit 400 has the same effect as the operation of the controlled-rotation gate.

Figure 6:
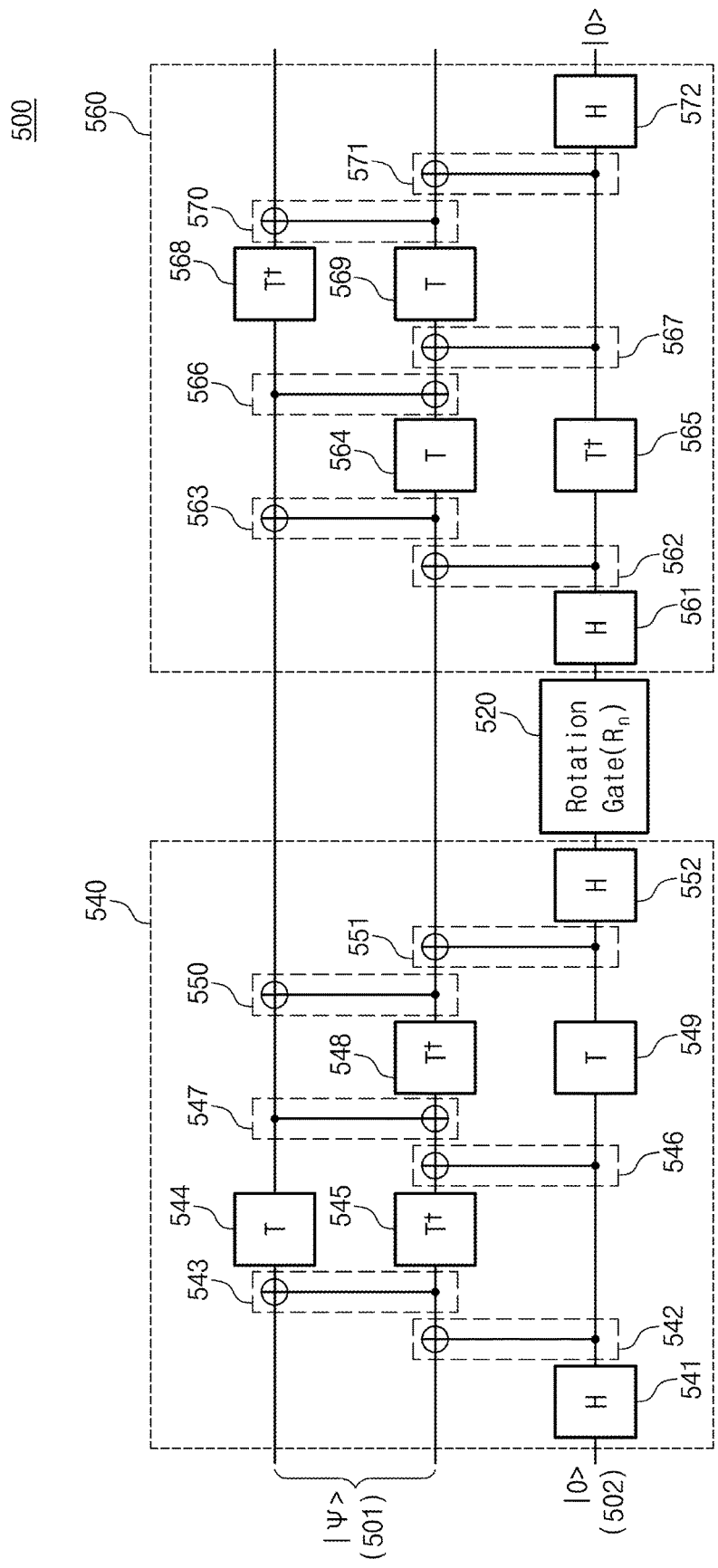
FIG. 6 is a circuit diagram embodying an embodiment of the quantum circuit of FIG. 4.

FIG. 6 is a circuit diagram embodying an embodiment of the quantum circuit of FIG. 4 Referring to FIG. 6, a quantum circuit 500 includes a rotation gate 520, a first auxiliary circuit 540, and a second auxiliary circuit 560. The rotation gate 520 corresponds to the rotation gate 320 of FIG. 4, the first auxiliary circuit 540 corresponds to the first auxiliary circuit 340 of FIG. 4, and the second auxiliary circuit 560 corresponds to the second auxiliary circuit 360 of FIG. 4. The logic qubit 501 including the control qubit and the target qubit, and the ancillary qubit 502 are inputted to the quantum circuit 500. The logic qubit 501 corresponds to the logic qubit 301 of FIG. 4 and the ancillary qubit 502 corresponds to the ancillary qubit 302 of FIG. 4.

The first auxiliary circuit 540 includes a first H-gate 541, a first CNOT gate 542, a second CNOT gate 543, a first T-gate 544, a second T-gate ($T^\dagger$-gate) 545, a third CNOT gate 546, a fourth CNOT gate 547, a third T-gate ($T^\dagger$-gate) 548, a fourth T-gate 549, a fifth CNOT gate 550, a sixth CNOT gate 551, and a second H-gate 552. The H-gate, T-gate, and CNOT gate included in the first auxiliary circuit 540 may be defined as described in Equations 2 and 3. The first auxiliary circuit 540 includes a total of 12 basic gates. Thus, a controlled-rotation gate may be implemented using fewer basic gates than the swap gate 240 including the 17 basic gates of FIG. 3.

The first H-gate 541 performs Hadamard transform on the ancillary qubit 502. The first CNOT gate 542 performs a CNOT calculation on the target qubit based on the ancillary qubit converted by the first H-gate 541. The second CNOT gate 543 performs a CNOT calculation on the control qubit based on the target qubit converted by the first CNOT gate 542. The first T-gate 544 shifts the phase of the control qubit converted by the second CNOT gate 543 by $\pi/8$. The second T-gate 545 shifts the phase of the target qubit converted by the first CNOT gate 542 by $-\pi/8$. The third CNOT gate 546 performs a CNOT calculation on the target qubit converted by the second T-gate 545 based on the ancillary qubit converted by the first H-gate 541. The fourth CNOT gate 547 performs a CNOT calculation on the target qubit converted by the third CNOT gate 546 based on the control qubit converted by the first T-gate 544. The third T-gate 548 shifts the phase of the target qubit converted by the fourth CNOT gate 547 by $-\pi/8$. The fourth T-gate 549 shifts the phase of the ancillary qubit converted by the first H-gate 541 by $\pi/8$. The fifth CNOT gate 550 performs a CNOT calculation on the control qubit converted by the first T-gate 544 based on the target qubit converted by the third T-gate 548. The sixth CNOT gate 551 performs a CNOT calculation on the target qubit converted by the third T-gate 548 based on the ancillary qubit converted by the fourth T-gate 549. The second H-gate 552 performs Hadamard transform on the ancillary qubit converted by the fourth T-gate 549.

The first auxiliary circuit 540 has more basic gates than the first auxiliary circuit 440 of FIG. 5 and operates with more operations. However, the first auxiliary circuit 540 of FIG. 6 considers the physically implemented distance between the qubits. The CNOT gates included in the first auxiliary circuit 540 are implemented to perform CNOT calculations on adjacent qubits. CNOT gates included in the first auxiliary circuit 540 are implemented not to perform CNOT calculations on non-contiguous qubits (e.g., ancillary qubits and control qubits).

The first auxiliary circuit 540 operates in a total of 10 operations and operates with a total of two T-gate operations. Since the first auxiliary circuit 540 operates with fewer T-gate operations than the controlled-swap gate 240 of FIG. 3, the operation time of the quantum circuit 500 and the resources for quantum computing may be reduced. The first auxiliary circuit 540 may be defined as U of Equation 7 based on the operation of the basic gates described above.

$$U = (I \otimes I \otimes H)C_{32}C_{21}(I \otimes T^\dagger \otimes T)C_{12}C_{31}(T \otimes T^\dagger \otimes I)C_{21}C_{32}(I \otimes I \otimes H) \quad \text{[Equation 7]}$$

Referring to Equation 7, an operation of the first auxiliary circuit 540 proceeds from right to left. During the first operation, by the first H-gate 541, $(I \otimes I \otimes H)$ calculation is performed for the 3-qubit state $(|\Psi\rangle \otimes |0\rangle)$ by the logic qubit 501 and the ancillary qubit 502. During the second operation, $C_{32}\neg$ calculation is performed by the first CNOT gate 542. During the third operation, $C_{21}\neg$ calculation is performed by the second CNOT gate 543. During the fourth operation, $(T \otimes T^\dagger \otimes I)$ calculation is performed by the first and second T-gates 544 and 545. During the fifth operation, $C_{31}\neg$ calculation is performed by the third CNOT gate 546. During the sixth operation, $C_{12}\neg$ calculation is performed by the fourth CNOT gate 547. During the seventh operation, $(I \otimes T^\dagger \otimes T)$ calculation is performed by the third and fourth T-gates 548 and 549. During the eighth operation, $C_{21}\neg$ calculation is performed by the fifth CNOT gate 550. During the ninth operation, $C_{32}\neg$ calculation is performed by the sixth CNOT gate 551. During the tenth operation, $(I \otimes I \otimes H)$ calculation is performed by the second H-gate 552. The calculation result of Equation 7 may be expressed as Equation 8.

$$U = |000\rangle\langle 000| + |001\rangle\langle 001| + |010\rangle\langle 100| + |011\rangle\langle 101|$$

$$+ |100\rangle\langle 010| + |101\rangle\langle 011| - i|110\rangle\langle 111| - i|111\rangle\langle 110| \quad \text{[Equation 8]}$$

Referring to Equation 8, the first auxiliary circuit 540 may not convert the values of the $|000\rangle$ and $|001\rangle$ basis states. The first auxiliary circuit 540 may exchange the values of the $|010\rangle$ basis states and the values of the $|100\rangle$ basis states and exchange the values of the $|011\rangle$ basis states and the

|101> basis states. The first auxiliary circuit 540 may shift the phase for the |110> basis state by $-\pi/2$ to determine it as the value of the |111> basis state. The first auxiliary circuit 440 may shift the phase for the |111> basis state by $-\pi/2$ to determine it as the value of the |110> basis state.

The second auxiliary circuit 560 may be Hermitian with the first auxiliary circuit 540. The second auxiliary circuit 560 includes a third H-gate 561, a seventh CNOT gate 562, an eighth CNOT gate 563, a fifth T-gate 564, a sixth T-gate ($T^\dagger$-gate) 565, a ninth CNOT gate 566, a tenth CNOT gate 567, a seventh T-gate ($T^\dagger$-gate) 568, an eighth T-gate 569, an eleventh CNOT gate 570, a twelfth CNOT gate 571, and a fourth H-gate 572. The number of basic gates included in the second auxiliary circuit 560 is equal to the number of basic gates included in the first auxiliary circuit 540. Since the arrangement of the third H-gate 561, the seventh CNOT gate 562, the eighth CNOT gate 563, the eleventh CNOT gate 570, the twelfth CNOT gate 571, and the fourth H-gate 572 is equal to the arrangement of the first H-gate 541, the first CNOT gate 542, the second CNOT gate 543, the fifth CNOT gate 550, the sixth CNOT gate 551, and the second H-gate 552 of the first auxiliary circuit 540, a detailed description thereof is omitted.

Compared to the first auxiliary circuit 540, the second auxiliary circuit 560 has a difference in the arrangement of a fifth T-gate 564, a sixth T-gate 565, a ninth CNOT gate 566, a tenth CNOT gate 567, a seventh T-gate 568, and an eighth T-gate 569. The fifth T-gate 564 shifts the phase of the target qubit converted by the seventh CNOT gate 562 by $\pi/8$. The sixth T-gate 565 shifts the phase of the ancillary qubit converted by the third H-gate 561 by $-\pi/8$. The ninth CNOT gate 566 performs a CNOT calculation on the target qubit converted by the fifth T-gate 564 based on the control qubit converted by the eighth CNOT gate 563. The tenth CNOT gate 567 performs a CNOT calculation on the target qubit converted by the ninth CNOT gate 566 based on the ancillary qubit converted by the sixth T-gate 565. The seventh T-gate 568 shifts the phase of the control qubit converted by the eighth CNOT gate 563 by $-\pi/8$. The eighth T-gate 569 shifts the phase of the target qubit converted by the tenth CNOT gate 567 by $\pi/8$.

The rotation gate 520, the first auxiliary circuit 540, and the second auxiliary circuit 560 may be implemented to perform the same operation as the controlled-rotation gate, as shown in Equation 9.

$$U^\dagger(I\otimes I\otimes Rn)U(|\Psi\rangle\otimes|0\rangle)$$

$$=U^\dagger(I\otimes I\otimes Rn)U(a_{00}|000\rangle+a_{01}|010\rangle+a_{10}|100\rangle+a_{11}|110\rangle)$$

$$=U^\dagger(I\otimes I\otimes Rn)(a_{00}|000\rangle+a_{01}|100\rangle+a_{10}|010\rangle-ia_{11}|111\rangle)$$

$$=U^\dagger(a_{00}|000\rangle+a_{01}|100\rangle+a_{10}|010\rangle-ie^{i\pi/2^{n-1}}a_{11}|111\rangle)$$

$$=a_{00}|000\rangle+a_{01}|010\rangle+a_{10}|100\rangle+e^{i\pi/2^{n-1}}a_{11}|110\rangle$$

$$=(\text{Controlled-}Rn\otimes I)(|\Psi\rangle\otimes|0\rangle) \quad [\text{Equation 9}]$$

Referring to Equation 9, the first auxiliary circuit 540, the single-qubit-based rotation gate 520, and the second auxiliary circuit 560 are operated from the right side to the left side. By the first auxiliary circuit 540, the value of the |110> basis state is phase-shifted by $-\pi/2$, so that the value of the |111> basis state is determined. By the first auxiliary circuit 540, the value of the |010> basis state and the value of the |100> basis state are exchanged with each other. By the rotation gate 520, the value of the |111> basis state is phase-shifted by $\pi/2^{n-1}$. By the second auxiliary circuit 560, the value of the |111> basis state is phase-shifted by $\pi/2$, so that the value of the |110> basis state is determined. In addition, by the second auxiliary circuit 560, the value of the |010> basis state and the value of the |100> basis state are exchanged with each other. As a result, the quantum circuit 500 has the same effect as the operation of the controlled-rotation gate.

Figure 7:
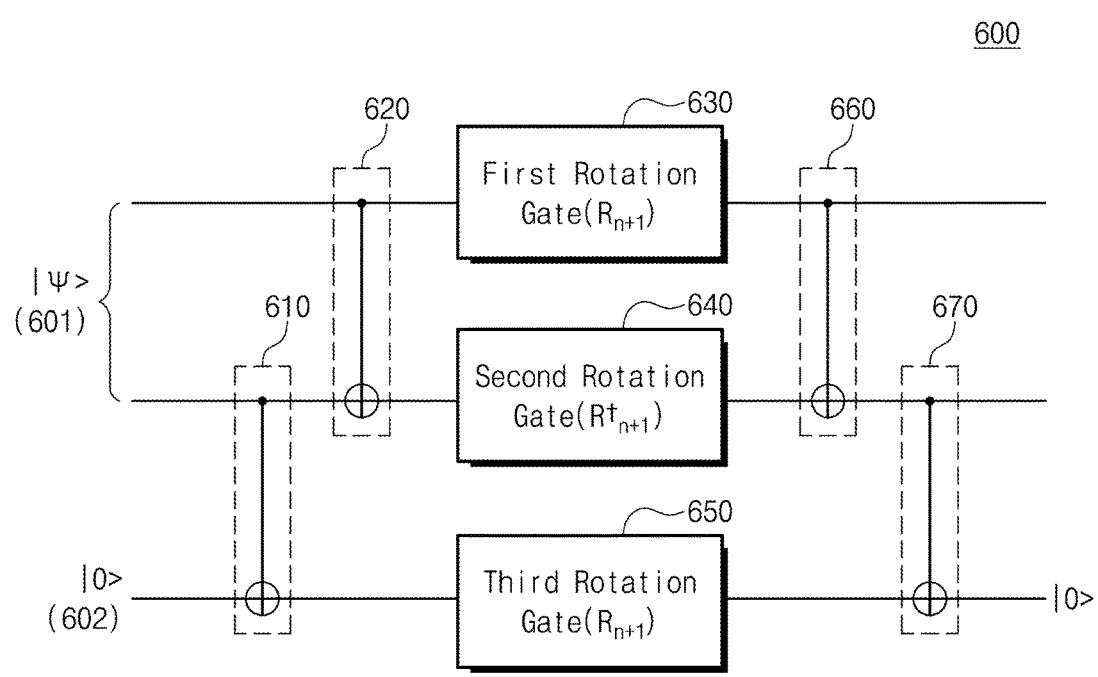
FIG. 7 is a circuit diagram of a quantum circuit according to an embodiment of the inventive concept.

FIG. 7 is a circuit diagram of a quantum circuit according to an embodiment of the inventive concept. Referring to 7, a quantum circuit 600 includes a first CNOT gate 610, a second CNOT gate 620, a first rotation gate 630, a second rotation gate 640, a third rotation gate 650, a third CNOT gate 660, and a fourth CNOT gate 670. The quantum circuit 600 is a circuit for implementing a controlled-rotation gate such as the quantum circuit 100 or 200 shown in FIG. 1 or FIG. 2. The quantum circuit 600 shifts the phase of the target qubit by $\pi/2^{n-1}$ based on the state of the control qubit.

A logic qubit 601 and an ancillary qubit 602 are inputted to the quantum circuit 600. The logic qubit 601 includes a control qubit and a target qubit. The ancillary qubit 602 may have a |0> state.

The first CNOT gate 610 performs a CNOT calculation on the ancillary qubit, based on the target qubit. The second CNOT gate 620 performs a CNOT calculation on the target qubit, based on the control qubit. The first rotation gate 630 shifts the phase of the control qubit by $\pi/2^n$. The second rotation gate 640 shifts the phase of the target qubit converted by the second CNOT gate 620 by $-\pi/2^n$. The third rotation gate 650 shifts the phase of the ancillary qubit converted by the first CNOT gate 610 by $\pi/2^n$. The third CNOT gate 660 may perform a CNOT calculation on the target qubit converted by the second rotation gate 640 based on the control qubit converted by the first rotation gate 630. The fourth CNOT gate 670 performs a CNOT calculation on the ancillary qubit converted by the third rotation gate 660 based on the target qubit converted by the third CNOT gate 650.

The quantum circuit 600 operates in a total of five operations. That is, the quantum circuit 600 of FIG. 7 may operate with minimum operations. Although the quantum circuit 100' decomposed into single-qubit-based rotation gates in FIG. 1 operates in four operations, since the operation time of the rotation gate is considerably larger than that of other basic gates, actually, the operation time of the quantum circuit 600 of FIG. 7 is shorter than that of the quantum circuit 100' of FIG. 1. The reason is that the first to third rotation gates 630, 640, and 650 operate in parallel in one operation in the quantum circuit 600. The quantum circuit 600 may be implemented to perform the same operation as the controlled-rotation gate, as shown in Equation 10.

$$C_{23}C_{12}(R_{n+1}\otimes R^\dagger_{n+1}\otimes R_{n+1})C_{12}C_{23}(|\Psi\rangle\otimes|0\rangle)$$

$$=C_{23}C_{12}(R_{n+1}\otimes R^\dagger_{n+1}\otimes R_{n+1})(a_{00}|000\rangle+a_{01}|011\rangle+a_{10}|110\rangle+a_{11}|101\rangle)$$

$$=C_{23}C_{12}(a_{00}|000\rangle+a_{01}|011\rangle+a_{10}|110\rangle+e^{i\pi/2^n}a_{11}|101\rangle)$$

$$=a_{00}|000\rangle+a_{01}|010\rangle+a_{10}|100\rangle+e^{i\pi/2^{n-1}}a_{11}|110\rangle$$

$$=(\text{Controlled-}Rn\otimes I)(|\Psi\rangle\otimes|0\rangle) \quad [\text{Equation 10}]$$

Referring to Equation 10, a first CNOT gate 610, a second CNOT gate 620, a first rotation gate 630, a second rotation gate 640, a third rotation gate 650, a third CNOT gate 660, and a fourth CNOT gate 670 operate from right to left.

During the first operation, $C_{23}\neg$ calculation is performed by the first CNOT gate 610. During the second operation, $C_{12}\neg$ calculation is performed by the second CNOT gate 620. During the third operation, $(R_{n+1} \otimes R^{\dagger}_{n+1} \otimes R_{n+1})$ calculation is performed by the first to third rogation gates 630, 640, and 650. During the fourth operation, $C_{12}\neg$ calculation is performed by the third CNOT gate 660. During the fifth operation, $C_{23}\neg$ calculation is performed by the fourth CNOT gate 670.

By the first CNOT gate 610 and the second CNOT gate 620, the value of the |010> basis state is determined as the value of the |011> basis state, the value of the |100> basis state is determined as the value of the |110> basis state, and the value of the |110> basis state is determined as the value of the |101> basis state. By the first to third rotation gates 630, 640 and 650, the value of the |101> basis state is phase-shifted by $\pi/2^{n-1}$. By the third CNOT gate 660 and the fourth CNOT gate 670, the value of the |011> basis state is determined as the value of the |010> basis state, the value of the |110> basis state is determined as the value of the |100> basis state, and the value of the |101> basis state is determined as the value of the |110> basis state.

According to the embodiments described above, the number of basic gates constituting the quantum circuit may be reduced, and the operation time of the quantum circuit may be reduced. A quantum computer in which a quantum circuit is implemented may be composed of a plurality of components that perform various functions. For example, a quantum computer in which the above-described quantum circuit is implemented may include a CPU for processing quantum information, a memory for storing quantum information, and a bus for transferring information between the CPU and the memory.

The CPU may function as a central processing unit of the quantum computer. The CPU may operate using the calculation space of the memory, and the quantum circuit may perform the operation of the controlled-rotation gate using the control qubit, the target qubit, and the ancillary qubit according to the control of the CPU. The quantum circuit may generate the control qubit, the target qubit, and the ancillary qubit under the control of the CPU and shift the phase of the target qubit by $n/2^{n-1}$ based on the state of the control qubit. By using the quantum circuit according to the embodiment of the inventive concept, the processing speed of the quantum information will be improved and the resources for processing the quantum information will be reduced.

A quantum circuit that shifts the phase of the target qubit based on the control qubit according to the embodiment of the inventive concept uses an ancillary qubit and reduces the number of basic gates, thereby reducing the resource and operation time of the quantum computing.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed.

What is claimed is:

1. A quantum circuit that shifts a phase of a target qubit by $\pi/2^{n-1}$ based on a control qubit, the quantum circuit comprising:
    a first auxiliary circuit configured to convert a first qubit state according to an entanglement of the control qubit, the target qubit, and an ancillary qubit having a |0> state to a second qubit state;
    a rotation gate configured to shift a phase for at least one basis state of the second qubit state by $\pi/2^{n-1}$ to convert the second qubit state to a third qubit state; and
    a second auxiliary circuit configured to convert the third qubit state to a fourth qubit state so as to shift the phase of the target qubit by $\pi/2^{n-1}$,
    wherein the first auxiliary circuit determines a |111> basis state of the second qubit state based on a |110> basis state of the first qubit state, and the second auxiliary circuit determines a |110> basis state of the fourth qubit state based on a |111> basis state of the third qubit state.

2. The quantum circuit of claim 1, wherein the first auxiliary circuit and the second auxiliary circuit are the same.

3. The quantum circuit of claim 1, wherein the first auxiliary circuit determines the |110> basis state of the second qubit state by shifting a phase for the |110> basis state of the first qubit state by $-\pi/2$, and
    the second auxiliary circuit determines the |111> basis state of the fourth qubit state by shifting a phase for the |111> basis state of the third qubit state by $\pi/2$.

4. The quantum circuit of claim 1, wherein the first auxiliary circuit comprises:
    a first Hadamard gate configured to perform Hadamard transform on the ancillary qubit;
    a first CNOT gate configured to perform a CNOT calculation on the control qubit based on the ancillary qubit converted by the first Hadamard gate;
    a first T-gate configured to shift the phase of the control qubit converted by the first CNOT gate by $\pi/8$;
    a second T-gate configured to shift the phase of the ancillary qubit converted by the first Hadamard gate by $-\pi/8$;
    a second CNOT gate configured to perform a CNOT calculation on the control qubit converted by the first T-gate, based on the target qubit;
    a third CNOT gate configured to perform a CNOT calculation on the ancillary qubit converted by the second T-gate, based on the target qubit;
    a third T-gate configured to shift the phase of the control qubit converted by the second CNOT gate by $-\pi/8$;
    a fourth T-gate configured to shift the phase of the ancillary qubit converted by the third CNOT gate by $\pi/8$;
    a fourth CNOT gate configured to perform a CNOT calculation on the control qubit converted by the third T-gate, based on the ancillary qubit converted by the fourth T-gate; and
    a second Hadamard gate configured to perform Hadamard transform on the ancillary qubit converted by the fourth T-gate.

5. The quantum circuit of claim 4, wherein the rotation gate shifts the phase of the ancillary qubit converted by the first auxiliary circuit by $\pi/2^{n-1}$,
    wherein the second auxiliary circuit comprises:
    a third Hadamard gate configured to perform Hadamard transform on the ancillary qubit converted by the rotation gate;
    a fifth CNOT gate configured to perform a CNOT calculation on the control qubit converted by the first auxiliary circuit, based on the ancillary qubit converted by the third Hadamard gate;
    a fifth T-gate configured to shift the phase of the control qubit converted by the fifth CNOT gate by $\pi/8$;
    a sixth T-gate configured to shift the phase of the ancillary qubit converted by the third Hadamard gate by $-\pi/8$;

a sixth CNOT gate configured to perform a CNOT calculation on the control qubit converted by the fifth T-gate, based on the target qubit converted by the first auxiliary circuit;

a seventh CNOT gate configured to perform a CNOT calculation on the ancillary qubit converted by the sixth T-gate, based on the target qubit converted by the first auxiliary circuit;

a seventh T-gate configured to shift the phase of the control qubit converted by the sixth CNOT gate by $-\pi/8$;

an eighth T-gate configured to shift the phase of the ancillary qubit converted by the seventh CNOT gate by $\pi/8$;

an eighth CNOT gate configured to perform a CNOT calculation on the control qubit converted by the seventh T-gate, based on the ancillary qubit converted by the eighth T-gate; and a fourth Hadamard gate configured to perform Hadamard transform on the ancillary qubit converted by the eighth T-gate.

6. The quantum circuit of claim 4, wherein
the first Hadamard Gate is operated for the first time,
the first CNOT gate is operated for a second time after the first time,
the first and second T-gates are operated for a third time after the second time,
the second CNOT gate is operated for a fourth time after the third time,
the third CNOT gate is operated for a fifth time after the fourth time,
the third and fourth T-gates are operated for a sixth time after the fifth time,
the fourth CNOT gate is operated for a seventh time after the sixth time, and
the second Hadamard Gate is operated for an eighth time after the seventh time.

7. The quantum circuit of claim 1, wherein the first auxiliary circuit generates the second qubit state through $|000\rangle\langle 000|+|001\rangle\langle 001|+|010\rangle\langle 010|-|011\rangle\langle 011|+|100\rangle\langle 100|+|101\rangle\langle 101|+i|110\rangle\langle 111|-i|111\rangle\langle 110|$ calculation, with respect to $|000\rangle$, $|001\rangle$, $|010\rangle$, $|011\rangle$, $|100\rangle$, $|101\rangle$, $|110\rangle$, and $|111\rangle$ basis states of the first qubit state, and the second auxiliary circuit generates the fourth qubit state through $|000\rangle\langle 000|+|001\rangle\langle 001|+|010\rangle\langle 010|-|100\rangle\langle 100|+|101\rangle\langle 101|+i|110\rangle\langle 111|-i|111\rangle\langle 110|$ calculation, with respect to $|000\rangle$, $|001\rangle$, $|010\rangle$, $|011\rangle$, $|100\rangle$, $|101\rangle$, $|110\rangle$, and $|111\rangle$ basis states of the third qubit state.

8. The quantum circuit of claim 1, wherein the first auxiliary circuit and the second auxiliary circuit are mutually Hermitian.

9. The quantum circuit of claim 1, wherein the first auxiliary circuit determines the $|111\rangle$ basis state of the second qubit state by shifting a phase for the $|110\rangle$ basis state of the first qubit state by $-\pi/2$, further determines the $|100\rangle$ basis state of the second qubit state based on the $|010\rangle$ basis state of the first qubit state, and further determines the $|010\rangle$ basis state of the second qubit state based on the $|100\rangle$ basis state of the first qubit state, and the second auxiliary circuit determines the $|110\rangle$ basis state of the fourth qubit state by shifting a phase for the $|111\rangle$ basis state of the third qubit state by $\pi/2$, further determines the $|100\rangle$ basis state of the fourth qubit state based on the $|010\rangle$ basis state of the third qubit state, and further determines the $|010\rangle$ basis state of the fourth qubit state based on the $|100\rangle$ basis state of the third qubit state.

10. The quantum circuit of claim 1, wherein the first auxiliary circuit comprises:

a first Hadamard gate configured to perform Hadamard transform on the ancillary qubit;

a first CNOT gate configured to perform a CNOT calculation on the target qubit based on the ancillary qubit converted by the first Hadamard gate;

a second CNOT gate configured to perform a CNOT calculation on the control qubit based on the target qubit converted by the first CNOT gate;

a first T-gate configured to shift a phase of the control qubit converted by the second CNOT gate by $\pi/8$;

a second T-gate configured to shift a phase of the target qubit converted by the first CNOT gate by $-\pi/8$;

a third CNOT gate configured to perform a CNOT calculation on the target qubit converted by the second T-gate based on the ancillary qubit converted by the first Hadamard gate;

a fourth CNOT gate configured to perform a CNOT calculation on the target qubit converted by the third CNOT gate based on the control qubit converted by the first T-gate;

a third T-gate configured to shift a phase of the target qubit converted by the fourth CNOT gate by $-\pi/8$;

a fourth T-gate configured to shift a phase of the ancillary qubit converted by the first Hadamard gate by $\pi/8$;

a fifth CNOT gate configured to perform a CNOT calculation on the control qubit converted by the first T-gate based on the target qubit converted by the third T-gate;

a sixth CNOT gate configured to perform a CNOT calculation on the target qubit converted by the third T-gate based on the ancillary qubit converted by the fourth T-gate; and a second Hadamard gate configured to perform Hadamard transform on the ancillary qubit converted by the fourth T-gate.

11. The quantum circuit of claim 10, wherein the rotation gate shifts a phase of the ancillary qubit converted by the first auxiliary circuit by $\pi/2^{n-1}$, wherein the second auxiliary circuit comprises:

a third Hadamard configured to perform Hadamard transform on the ancillary qubit converted by the rotation gate;

a seventh CNOT gate configured to for perform a CNOT calculation on the target qubit converted by the first auxiliary circuit based on the ancillary qubit converted by the third Hadamard gate;

an eighth CNOT gate configured to perform a CNOT calculation on the control qubit converted by the first auxiliary circuit based on the target qubit converted by the seventh CNOT gate;

a fifth T-gate configured to shift a phase of the target qubit converted by the seventh CNOT gate by $\pi/8$;

a sixth T-gate configured to shift a phase of the ancillary qubit converted by the third Hadamard gate by $-\pi/8$;

a ninth CNOT gate configured to perform a CNOT calculation on the target qubit converted by the fifth T-gate based on the control qubit converted by the eighth CNOT gate;

a tenth CNOT gate configured to perform a CNOT calculation on the target qubit converted by the ninth CNOT gate based on the ancillary qubit converted by the sixth T-gate;

a seventh T-gate configured to shift a phase of the control qubit converted by the eighth CNOT gate by $-\pi/8$;

an eighth T-gate configured to shift a phase of the target qubit converted by the tenth CNOT gate by $\pi/8$;

an eleventh CNOT gate configured to perform a CNOT calculation on the control qubit converted by the seventh T-gate based on the target qubit converted by the eighth T-gate;

a twelfth CNOT gate configured to perform a CNOT calculation on the target qubit converted by the eighth T-gate based on the ancillary qubit converted by the sixth T-gate; and a fourth Hadamard gate configured to perform Hadamard transform on the ancillary qubit converted by the sixth T-gate.

12. The quantum circuit of claim 10, wherein the first Hadamard Gate is operated for the first time, the first CNOT gate is operated for a second time after the first time, the second CNOT gate is operated for a third time after the second time, the first and second T-gates are operated for a fourth time after the third time, the third CNOT gate is operated for a fifth time after the fourth time, the fourth CNOT gate is operated for a sixth time after the fifth time, the third and fourth T-gates are operated for a seventh time after the sixth time, the fifth CNOT gate is operated for an eighth time after the seventh time, the sixth CNOT gate is operated for the ninth time after the eighth time, and the second Hadamard gate is operated for a tenth time after the ninth time.

13. The quantum circuit of claim 1, wherein the first auxiliary circuit generates the second qubit state through |000><000|+|001><001|+|010><100|+|011><101|+|100><010|+|101><011|−i|110><111|−i|111><110| calculation, with respect to |000>, |001>, |010>, |011>, |100>, |101>, |110>, and |111> basis states of the first qubit state, and the second auxiliary circuit generates the fourth qubit state through |000><000|+|001><001|+|010><100|+|011><101|+|100><010|+|101><011|+i|110><111|+i|111><110| calculation, with respect to |000>, |001>, |010>, |011>, |100>, |101>, |110>, and |111> basis states of the third qubit state.

14. A quantum circuit that shifts a phase of a target qubit by $\pi/2^{n-1}$ based on a control qubit, the quantum circuit comprising:

a first CNOT gate configured to perform a CNOT calculation on an ancillary qubit having a |0> state based on the target qubit;

a second CNOT gate configured to perform a CNOT calculation on the target qubit based on the control qubit;

a first rotation gate configured to shift a phase of the control qubit by $\pi/2^n$;

a second rotation gate configured to shift a phase of the target qubit converted by the second CNOT gate by $-\pi/2^n$;

a third rotation gate configured to shift a phase of the ancillary qubit converted by the first CNOT gate by $\pi/2^n$;

a third CNOT gate configured to perform a CNOT calculation on the target qubit converted by the second rotation gate based on the control qubit converted by the first rotation gate; and a fourth CNOT gate configured to perform a CNOT calculation on the ancillary qubit converted by the third rotation gate based on the target qubit converted by the third CNOT gate.

15. The quantum circuit of claim 14, wherein the first CNOT gate and the second CNOT gate convert a first qubit state according to an entanglement of the control qubit, the target qubit, and the ancillary qubit to a second qubit state, and determine a value of a |110> basis state of the first qubit state as a value of a |101> basis state of the second qubit state, the first to third rotation gates convert the second qubit state to a third qubit state, and shift a phase for the |101> basis state of the second qubit state by $\pi/2^{n-1}$ to determine a |101> basis state of a third qubit state, and the third CNOT gate and the fourth CNOT gate convert the third qubit state to a fourth qubit state, and determine a value of the |101> basis state of the third qubit state as a value of a |110> basis state of the fourth qubit state.

16. The quantum circuit of claim 14, wherein the first CNOT is operated for the first time, the second CNOT gate is operated for a second time after the first time, the first to third rotation gates are operated for a third time after the second time, the third CNOT gate is operated for a fourth time after the third time, and the fourth CNOT gate is operated for a fifth time after the fourth time.

* * * * *